US009298201B2

(12) United States Patent
Mathiyalagan et al.

(10) Patent No.: US 9,298,201 B2
(45) Date of Patent: Mar. 29, 2016

(54) POWER DELIVERY TO THREE-DIMENSIONAL CHIPS

(71) Applicant: International Business Machines Corporation, Armonk, NY (US)

(72) Inventors: Vijay A. Mathiyalagan, Tamil Nadu (IN); Siva Rama K. Pullelli, Jalapavari Gudem (IN); Saravanan Sethuraman, Bangalore (IN); Kenneth L. Wright, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 14/132,506

(22) Filed: Dec. 18, 2013

(65) Prior Publication Data

US 2015/0168972 A1    Jun. 18, 2015

(51) Int. Cl.
*G11C 5/14* (2006.01)
*G05F 1/625* (2006.01)

(52) U.S. Cl.
CPC . *G05F 1/625* (2013.01); *G11C 5/14* (2013.01)

(58) Field of Classification Search
CPC .................................. G11C 5/14; G05F 1/625
USPC ......................................................... 365/226
See application file for complete search history.

(56) References Cited

U.S. PATENT DOCUMENTS

| 8,473,762 B2 | 6/2013 | Dennard et al. |
| 8,476,112 B2 | 7/2013 | Barowski et al. |
| 2009/0174429 A1 | 7/2009 | Norman |
| 2012/0250443 A1 | 10/2012 | Saraswat et al. |
| 2013/0055185 A1 | 2/2013 | Bose et al. |
| 2013/0279276 A1* | 10/2013 | Schaefer ................ 365/189.011 |
| 2015/0003181 A1* | 1/2015 | Droege et al. ................. 365/226 |

FOREIGN PATENT DOCUMENTS

| CN | 1811986 A | 8/2006 |
| CN | 102456398 A | 5/2012 |
| CN | 102569255 A | 7/2012 |

OTHER PUBLICATIONS

Facchini M., et al., "System-level Power/performance Evaluation of 3D stacked DRAMs for Mobile Applications," Design, Automation & Test in Europe Conference & Exhibition, 2009. 6 pages. DOI: 10.1109/DATE.2009.5090797.

Khan, N., et al., "Power Delivery Design for 3-D ICs Using Different Through-Silicon Via (TSV) Technologies," IEEE Transactions on Very Large Scale Integration (VLSI) Systems, vol. 19, No. 4, Apr. 2011. DOI: 10.1109/TVLSI.2009.2038165.

(Continued)

*Primary Examiner* — Alexander Sofocleous
*Assistant Examiner* — Alfredo Bermudez Lozada
(74) *Attorney, Agent, or Firm* — Penny L. Lowry

(57) ABSTRACT

The present disclosure includes a three dimensional (3D) integrated device comprising a first die having a first supply line and a second die having a second supply line, a power header, and voltage selection logic. The power header is connected to the first die and the second die and configured to generate a first voltage on a first voltage line and a second voltage on a second voltage line. The voltage selection logic is connected to the first supply line and the second supply line and configured to select between the first voltage line and the second voltage line for each of the first supply line and the second supply line.

6 Claims, 4 Drawing Sheets

(56) References Cited

OTHER PUBLICATIONS

Micheli, G., et al., "Design Methods and Tools for 3D Integration," 2011 Symposium on VLSI Technology Digest of TEchnical Papers. pp. 182-183.

Singh, P., et al., "Power Delivery Network Design and Optimization for 3D Stacked Die Designs," 2010 IEEE 3D Systems Integration Conference. pp. 1-6. DOI: 10.1109/3DIC.2010.5751475.

* cited by examiner

POWER DELIVERY TO THREE-DIMENSIONAL CHIPS

BACKGROUND

This disclosure relates to three-dimensional (3D) integrated circuits. In particular, it relates to power delivery in 3D integrated circuits using multiple supply voltages. Three dimensional (3D) chips offer hardware developers the ability to arrange memory in a compact design. Due to this compactness, 3D chips offer several advantages over traditional 2D chips, such as reduced voltage variation, non-uniform die configurations, and reduced pin count. 3D chips also offer some obstacles, such as power supply noise. Power can delivered to 3D chip components by microconnects, such as inductive solder bumps, between dies and by through-silicon-vias (TSVs) within dies.

SUMMARY

The present disclosure includes a three dimensional (3D) integrated device comprising a first die having a first supply line and a second die having a second supply line, a power header, and voltage selection logic. The power header is connected to the first die and the second die and configured to generate a first voltage on a first voltage line and a second voltage on a second voltage line. The voltage selection logic is connected to the first supply line and the second supply line and configured to select between the first voltage line and the second voltage line for each of the first supply line and the second supply line.

The present disclosure also includes a method for supplying voltage to a 3D integrated device, comprising generating a first voltage on a first voltage line and a second voltage on a second voltage line. A first power consideration for a first die and a second power consideration for a second die are received. A first desired voltage for the first die based on the first power consideration and a second desired voltage for the second die based on the second power consideration are determined. A first control signal, based on the first desired voltage, is provided to voltage selection logic configured to select, based on the first control signal, between the first voltage line and the second voltage line for a first supply line on the first die. A second control signal, based on the second desired voltage, is provided to voltage selection logic configured to select, based on the second control signal, between the first voltage line and the second voltage line for a second supply line on the second die.

The present disclosure also includes a power-delivery system for a 3D integrated circuit, comprising a plurality of dies, a power header, voltage selection logic, and voltage determination logic. The plurality of dies are in a stacked relationship and have a plurality of power interconnects in the dies. The power header is connected to the plurality of dies and configured to generate a plurality of voltages on respective power interconnects of the plurality of power interconnects. The voltage selection logic on each respective die is connected to the plurality of power interconnects and configured to select a power interconnect corresponding to a voltage according to inputs from voltage determination logic. The voltage determination logic is configured to receive power consideration inputs and control the voltage selection logic on the respective die.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of typical embodiments of the invention and do not limit the invention.

DETAILED DESCRIPTION

Figure 1A:
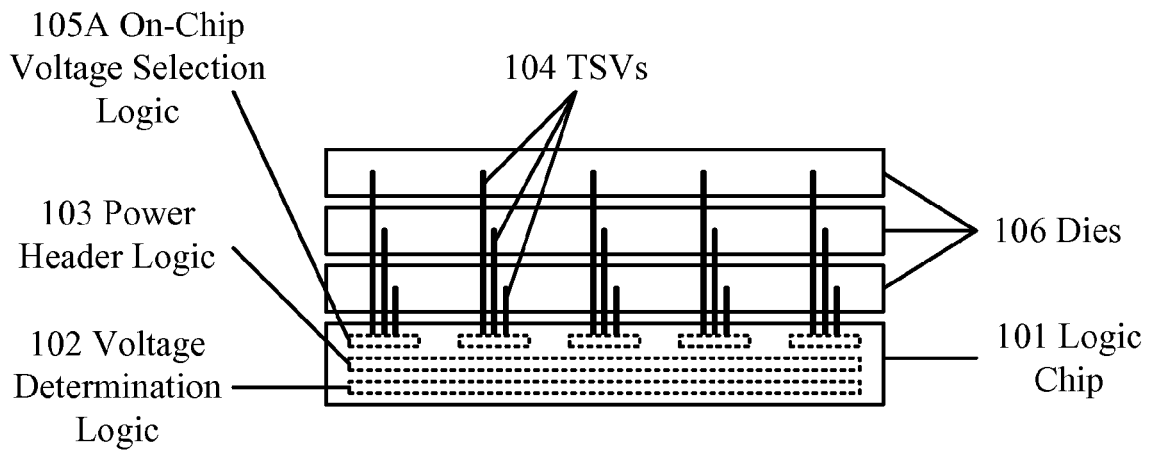
FIG. 1A is a diagram of a 3D stacked chip utilizing multiple voltages lines for power delivery to dies with voltage line selection on a logic chip, according to embodiments of the disclosure.

Aspects of the present disclosure relate to power delivery to 3D chips; more particularly, aspects relate to selectable power delivery to different chips. While the present disclosure is not necessarily limited to such applications, various aspects of the disclosure may be appreciated through a discussion of various examples using this context.

Aspects of the present disclosure related to recognition of various aspects of 3D chips. For instance, 3D chips can have a high packaging density that increases the current per unit area compared to 2D technology. This can lead to increased power consumption for a volume, which may generate more heat and lead to thermal problems. Additionally, an increase in current supplied to packaging pins of the 3D chip may lead to power delivery problems.

3D chips often contain dies manufactured from different process technologies. These chips may vary in the required or optimal voltage supplied to each die in the 3D chip. For example, a processor and a memory, used by the processor, may be stacked in a 3D chip, and the processor may require a higher voltage to operate than the memory. If a high supply voltage is used, the 3D chip may use more power and create more heat. Additionally, a die may have different performance characteristics and may utilize different voltages than other dies based on manufacturing variations determined in testing or operation.

According to embodiments of the disclosure, power is supplied at multiple supply voltages to dies in a 3D chip through multiple voltage lines/rails. A power header converts a chip voltage into multiple supply voltages across multiple voltage lines. The desired voltage is accessed by selecting the corresponding voltage line through selection logic, such as a switch or multiplexor logic. The desired voltage may be determined by factors such as die manufacturing variation, die operation, and performance considerations. The voltage in a die may be sensed and regulated through feedback to a regulation control circuit.

By providing multiple supply voltages to dies in a 3D chip, the 3D chip may have the flexibility to accommodate different die types with varying voltage requirements. Different voltages may be supplied to the dies so that each die may receive a suitable voltage according to its operation, performance, or manufacturing characteristics. Further, designs may accommodate existing technology. Voltage regulation circuitry may reside off the dies on a logic chip. Voltage selection logic may be on each die to accommodate existing TSV fabrication or on a logic chip to accommodate existing dies. Existing power delivery channels or interconnects, such as through silicon vias (TSVs) and microconnects, may be used as the voltage lines/rails between the power header and the dies.

Additionally, by switching between supply voltages on multiple voltage lines, voltage for a die may be adjusted dynamically at a faster rate. Each voltage line may deliver a statically-held and dynamically-adjusted voltage that may quickly be selected through power gating. When a die selects a supply voltage, the corresponding voltage line may already be charged to the supply voltage, which may reduce the voltage transients and improve switching times. Faster switching times may enable greater voltage adjustment for power reduction and performance increase, as voltages may be quickly alternated between a high voltage for an active die and a low voltage for a passive die. Voltage lines may be switched without affecting die selection.

Figure 1B:
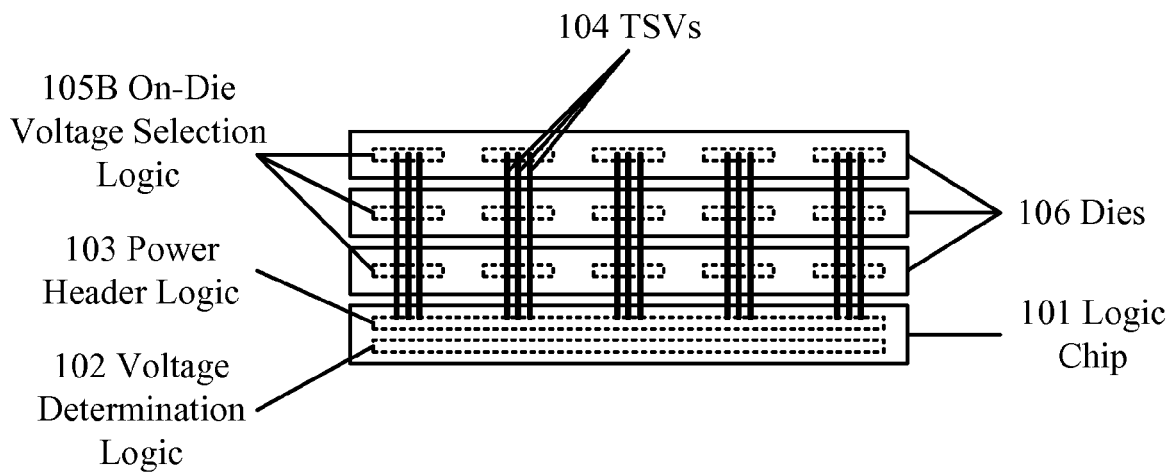
FIG. 1B is a diagram of a 3D stacked chip utilizing multiple voltages lines for power delivery to dies with voltage line selection on each die, according to embodiments of the disclosure.

FIG. 1A is a diagram of a 3D stacked chip utilizing multiple voltages lines for power delivery to stacked dies, with voltage line selection on a logic chip, according to embodiments of the disclosure. FIG. 1B is a diagram of a 3D stacked chip utilizing multiple voltages lines for power delivery to stacked dies, with voltage line selection on each die, according to embodiments of the disclosure. A logic chip 101 can support a variety of different circuits including, but not necessarily limited to, circuits that provide multiple different power supply voltages. Consistent with various embodiments, the 3D chip can include two or more dies 106, which can be stacked on the logic chip 101. The dies 106 may be a wide variety of dies, including memory dies, processor dies, logic dies, I/O chip, ASICS, and combinations thereof. Power header logic 103 can be configured to interface with through silicon vias (TSVs) 104 acting as power rails and to the die 106. The power header logic 103 may generate multiple (standard) voltages from a chip supply voltage.

Voltage selection logic 105A and 105B can be used to select and route different power supply voltages to different die. In some embodiments, as shown by FIG. 1A, the voltage selection logic 105A can be located on the logic chip 101. In other embodiments, as shown by FIG. 1B, the voltage selection logic 105B can be located on one or more dies 106. Embodiments also allow for the voltage selection logic 105 to be split between both the logic chip 101 and one or more of the dies 106.

In certain embodiments, voltage determination logic circuit 102 can provide controlling signals to the control logic. For instance, the voltage determination logic circuit 102 can be configured to dynamically adjust the voltage levels for different die 106 based upon system feedback (e.g., changes to processing demands or heat). In embodiments, the voltage determination logic 102 can be located on the logic chip 101, on a remote circuit or computer or combinations thereof.

Various embodiments allow for control logic to be set to a static value. For instance, a voltage for each die can be selected based upon data representing manufacturing results (e.g., by testing performance of the die) and set using read only memory, e-fuses or the like.

Figure 2:
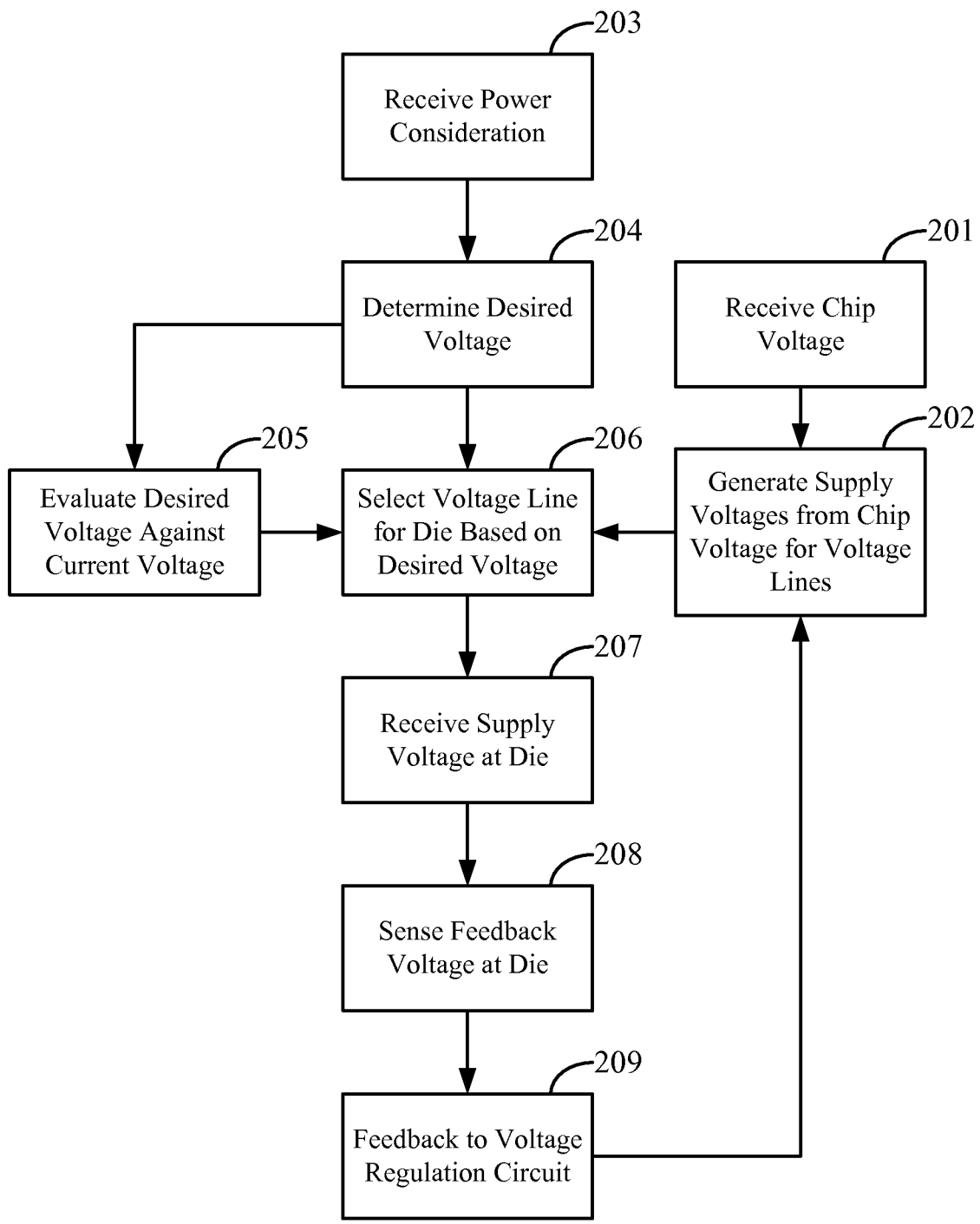
FIG. 2 is flowchart for power delivery in a 3D chip having multiple voltage lines, according to embodiments of the disclosure.

FIG. 2 is a flowchart of power delivery in a 3D chip having multiple supply voltage lines, according to embodiments of the disclosure. A power header receives a chip supply voltage, as in 201. The power header generates two or more supply voltages from the chip voltage for voltage lines, as in 202. For example, the power header may receive a chip supply voltage of 1.5V. This supply voltage may be preserved as the "high supply voltage" on a high supply voltage line. The power header may reduce the chip supply voltage to 1.4V as a "mid supply voltage" for a mid supply voltage line and 1.3V as a "low supply voltage" for a low supply voltage line.

A logic chip receives a power consideration from the processor, as in 203. The power consideration may be any operational condition associated with a particular voltage for use by one or more chips. Examples of power considerations include: manufacturing characteristics of a particular die such as threshold voltage; operations performed on the die, such as refresh or write operations for DRAM dies; performance considerations such as increased workload; manufacturing defects in the die; and other factors affected by the voltage and amount of power to the 3D chip. Two example classes of power considerations are die characteristics and die commands, according to embodiments of the disclosure.

Die characteristics may include performance or manufacturing characteristics of a die. Dies in a 3D chip may require or operate more effectively at a certain supply voltage or voltages. The die may be a particular type of chip that operates more effectively at a particular voltage based on its function. For example, a processor may require a higher voltage to achieve a higher frequency, while a logic chip or memory may utilize a lower voltage. Additionally or alternately, a die may require or perform better at a different voltage due to manufacturing variations. For example, during testing and die sorting, a processor die may be identified as a die with slower transistor performance and which would operate more effectively at a higher voltage to bring its performance in line with faster dies. Such a characteristic may be determined in testing or performance evaluation. The die's characteristics or desired voltage may be programmed onto the die, such as by an e-fuse, and identified during determination of the desired voltage for the die.

Die commands may be based on operations performed on or by a particular die, and may not be inherent in the die's design or manufacture. Power consumption and performance may be improved for the 3D chip based on changes in activity for a die. For example, a system may monitor the workload of a particular die, such as a processor, using processor registers or monitors. If the workload increases, the voltage may be increased to the particular die to improve performance. If the workload decreased, the voltage may be decreased to the particular die to reduce power consumption. Additionally or alternately, the system may identify certain commands that may utilize different voltage levels and optimize voltages for those commands for a die to improve performance or reduce power. For example, a memory die may utilize different voltages for different memory operations. If the memory is idle, in a power-down mode, or between refresh operations, the memory may receive a low voltage; if the memory is refreshing, it may increase to a high voltage for the refresh operations; if the memory performs a read or write operation, a mid voltage may be used.

The desired voltage for the die may be determined, as in 204. The desired voltage may be determined from the power considerations discussed above. This determination may involve determining the power consideration from a source on the die itself, such as through an e-fuse holding the power consideration, or from logic in the system, such as a processor or logic chip. The desired voltage may be a specific voltage associated with a particular operation, such as a supply voltage for a memory read. The desired voltage may be a specific voltage calculated according to performance requirements, such as a supply voltage computed with a power management algorithm. Alternatively, the desired voltage may be a voltage relative to the current voltage, such as a voltage that is a next step increase to the current voltage. In such an instance, the desired voltage may be evaluated against the current voltage of the die to determine if a change is necessary, as in 205.

Selection logic selects the supply voltage line for a die based on the determined desired voltage, as in 206. The die receives the supply voltage from the selected supply voltage line, as in 207, and distributes the supply voltage across its distribution network. The voltage of the die may be sampled and sensed as a feedback voltage, as in 208. The feedback voltage may be sent to a voltage regulation circuit, as in 209. The feedback voltage may be used to adjust the supply voltages on the supply voltage lines, as in 204.

According to embodiments of the disclosure, voltage line selection may occur on a logic chip. Each die may not require any additional voltage selection logic. Each die may have one or more TSVs acting as power rails delivering power to the specific die. In some embodiments, only the required voltages may be fused to the die. This design may be useful for 3D chips using standard dies that do not have additional logic or for 3D chips having a small footprint with fewer TSVs available for power delivery.

Figure 3:
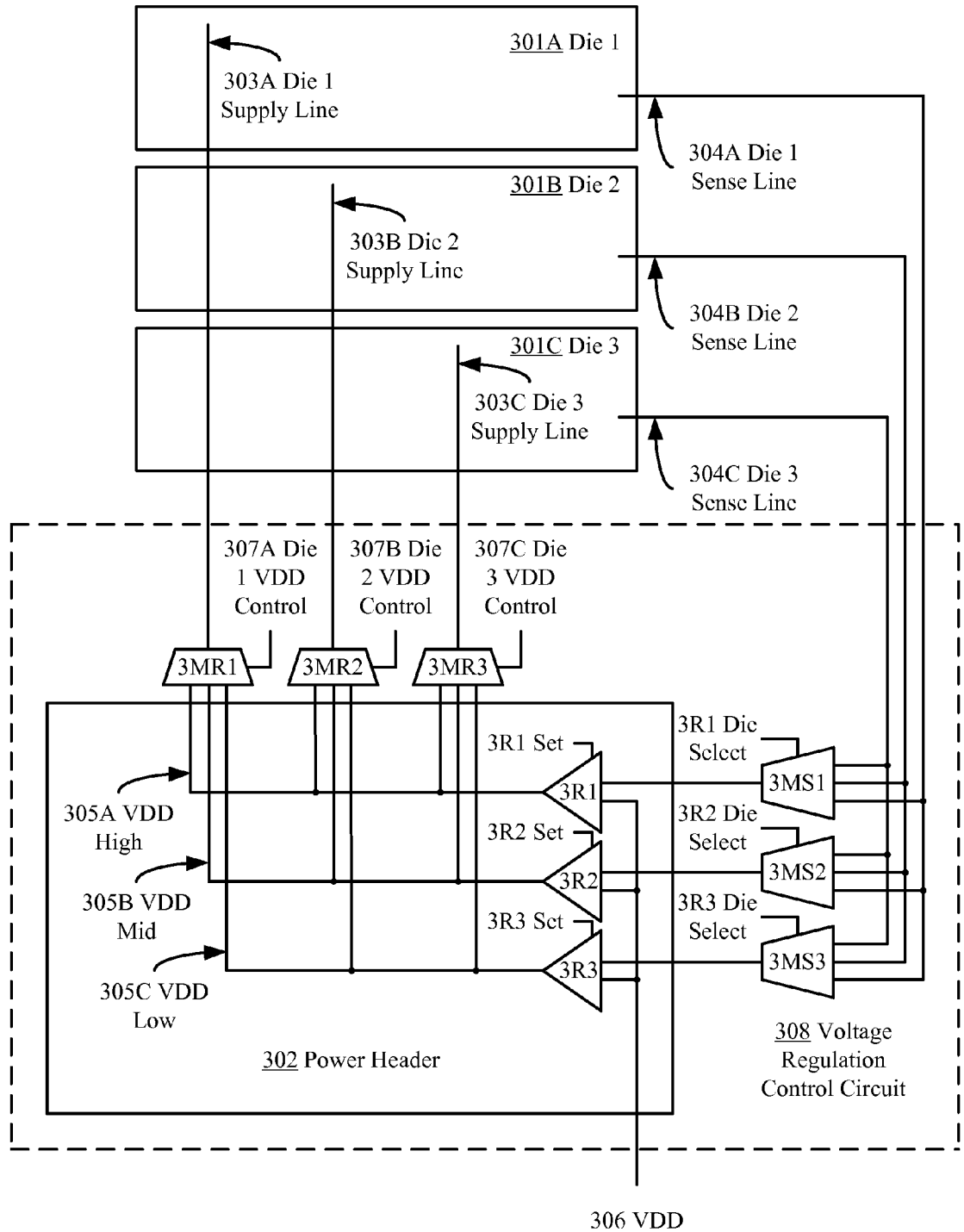
FIG. 3 is a diagram of a 3D chip with voltage line selection on a logic chip, according to embodiments of the disclosure.

FIG. 3 is a diagram of a 3D chip with voltage line selection in a power header, according to embodiments of the disclosure. Similar components may be referred to generically; for example, die 1 301A, die 2 301B, and die 3 301C may be referred to generically as die 301. The particular number of die and related components can vary according to the particular application and various embodiments can include more or less dies than what is depicted in FIG. 3.

A voltage regulation control circuit 308 contains a power header 302. The power header 302 receives a chip voltage on a chip voltage line $V_{DD}$ 306 and supplies the chip voltage to one or more voltage regulators 3R1, 3R2, 3R3 controlled by regulator set signals (3R1 Set, 3R2 Set, 3R3 Set). Each voltage regulator 3R generates a voltage on a respective voltage supply line 305A, 305B, 305C from the chip voltage line $V_{DD}$ 306. The regulator set signals 3R Set may be controlled by commands or programmable logic in the power header 302 to produce specific supply voltages for each voltage regulator 3R. In this example, supply voltages are generated for three different voltages lines 305 each carrying a specific supply voltage: VDD high 305A, VDD mid 305B, and VDD low 305C.

The voltage regulation circuit 308 may contain voltage selection logic having one or more voltage selection devices 3MR1, 3MR2, 3MR3 operated by VDD control lines 307A, 307B, 307C to select the desired voltage line 305 for a particular die 301. A die supply line 303A, 303B, 303C, such as a TSV, may carry the corresponding voltage to the die 301. A die sense line 304A, 304B, 304C may carry a feedback voltage to one or more feedback devices 3MS1, 3MS2, 3MS3 operated by die select lines (3R1 Die Select, 3R2 Die Select, 3R3 Die Select) in the voltage regulation circuit 308. Each feedback device 3MS may supply a feedback voltage to one or more of the voltage regulators 3R in the power header 302.

According to certain embodiments of the disclosure, voltage line selection may occur in each die. TSVs may be grouped as voltage rails and carry voltage to two or more dies in the 3D chip. TSV connections for each power rail may be fixed or programmed from logic. Each die may have a voltage rail selected as a supply voltage line using voltage line selection logic on each die. The selection logic on the die may act as power gating logic for each die to the voltage rails running through the die, which are charged to a stable voltage. This design may be utilized for dies capable of operating under multiple voltages, as it may reduce switching times and allow for reduced power consumption during idle or passive operations.

Figure 4:
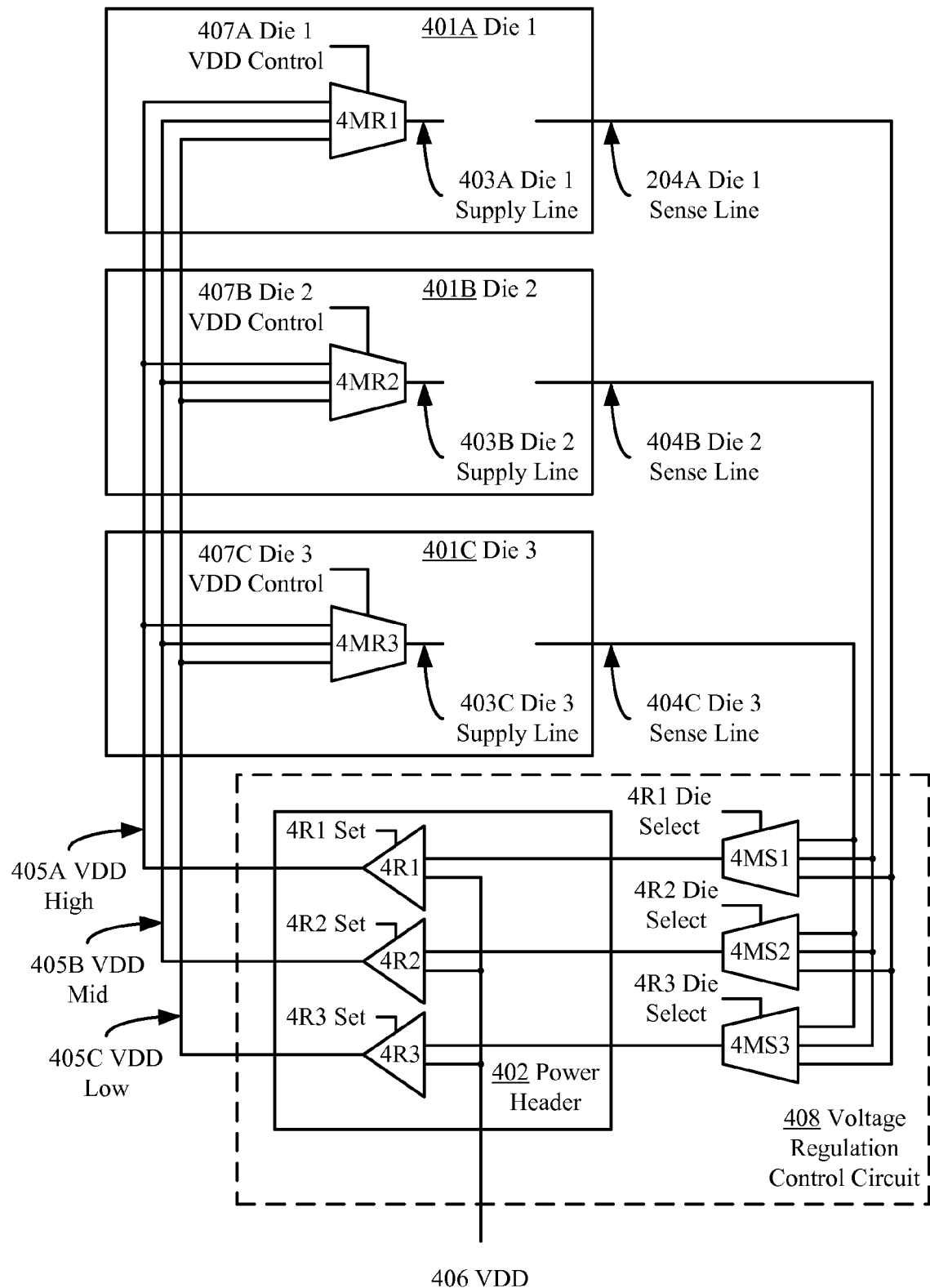
FIG. 4 is a diagram of a 3D chip with voltage line selection on each die, according to embodiments of the disclosure.

FIG. 4 is a diagram of a 3D chip with voltage line selection within each die, according to embodiments of the disclosure. Similar components may be referred to generically; for example, die 1 401A, die 2 401B, and die 3 401C may be referred to generically as die 401. The particular number of die and related components can vary according to the particular application and various embodiments can include more or less dies than what is depicted in FIG. 4.

A voltage regulation control circuit 408 may contain a power header 402. The power header 402 receives a chip voltage on a chip voltage line $V_{DD}$ 406, which supplies the chip voltage to one or more voltage regulators 4R1, 4R2, 4R3 controlled by regulator set signals (4R1 Set, 4R2 Set, 4R3 Set). Each voltage regulator 4R generates a voltage on a voltage supply line 405A, 405B, 405C from the chip voltage line $V_{DD}$ 406. The regulator set signal 4R Set may be controlled by commands or programmable logic in the power header 402 to produce specific supply voltages for each voltage regulator 4R. In this example, voltages are generated on three different voltages lines: VDD high 405A, VDD mid 405B, and VDD low 405C.

Each voltage line 405 is connected to a die 401. Each die 401 contains voltage selection logic having a voltage selection device 4MR1, 4MR2, 4MR3 operated by a VDD control line 407A, 407B, 407C to select the desired voltage line 405. A die supply line 403A, 403B, 403C may carry the desired voltage to a voltage distribution circuit in the die 401. A die sense line 404A, 404B, 404C carries a feedback voltage to one or more feedback devices 4MS1, 4MS2, 4MS3 operated by 4R Die Select lines in the voltage regulation circuit 408. Each feedback device 4MS may supply one or more of the voltage regulators 4R in the power header 402.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although the present disclosure has been described in terms of specific embodiments, it is anticipated that alterations and modifications thereof will become apparent to those skilled in the art. Therefore, it is intended that the following claims be interpreted as covering all such alterations and modifications as fall within the true spirit and scope of the disclosure.

What is claimed is:

1. A three dimensional (3D) integrated device, comprising:
   a first die having a first supply line;
   a second die having a second supply line;
   a first sense line configured to provide a feedback voltage from the first die;
   a second sense line configured to provide a feedback voltage from the second die;
   a power header connected to the first die and to the second die and configured to generate a first voltage on a first voltage line and a second voltage on a second voltage line, the power header including a first voltage regulator having inputs of a chip supply voltage line and the first sense line and an output of the first voltage line the power header further having a second voltage regulator having inputs of the chip supply voltage line and the second sense line and an output of the second voltage line;
a voltage regulation circuit configured to modify the first voltage and the second voltage based on the feedback voltages provided from the first and second sense lines; and
a voltage selection logic connected to the first supply line and to the second supply line and configured to select between the first voltage line and the second voltage line for each of the first supply line and the second supply line, the voltage selection logic including a first multiplexor logic having inputs of the first voltage line and the second voltage line and an output to the first supply line, the voltage selection logic further including a second multiplexor logic having inputs of the first voltage line and the second voltage line and an output to the second supply line.

2. The device of claim 1, wherein:
the voltage selection logic is part of the first die and the second die; and
at least a portion of each of the first voltage line and the second voltage line is a through silicon via.

3. The device of claim 1, wherein:
the voltage selection logic is on a logic chip; and
at least a portion of each of the first supply line and the second supply line is a through silicon via.

4. The device of claim 1, further comprising voltage determination logic configured to modify the voltage selection of the voltage selection logic for a die in response to a power consideration.

5. The device of claim 4, wherein the power consideration is one of a die workload change, a die manufacturing defect, and a die operation.

6. The device of claim 1, wherein the first die and the second die are configured to provide memory for a processor.

* * * * *